United States Patent [19]
Albert et al.

[11] Patent Number: 5,006,951
[45] Date of Patent: Apr. 9, 1991

[54] LOCK HANDLE FOR PRINTED WIRING BOARD ASSEMBLIES AND THE LIKE

[75] Inventors: Guy D. Albert; Robert C. Beaty, both of Raleigh, N.C.

[73] Assignee: Alcatel NA Network Systems Corp., Raleigh, N.C.

[21] Appl. No.: 348,034

[22] Filed: May 5, 1989

[51] Int. Cl.$^5$ .......................... H05K 7/14; H05F 3/02
[52] U.S. Cl. .................... 361/220; 361/212; 361/399; 361/415; 439/157; 439/160
[58] Field of Search ............... 361/212, 220, 391, 399, 361/412, 413, 415; 439/153, 157, 159, 160, 372; 211/41; 403/321, 322, 405.1, 406.1; 24/453, 458; 292/107, 116, 120, 209

[56] References Cited

U.S. PATENT DOCUMENTS

| | | | |
|---|---|---|---|
| 4,083,616 | 4/1978 | McNiece et al. | 439/157 |
| 4,313,150 | 1/1982 | Chu | 439/160 X |
| 4,564,250 | 1/1986 | Klein et al. | 361/412 X |
| 4,602,835 | 6/1986 | Bauer et al. | 439/160 |
| 4,614,389 | 9/1986 | Albert et al. | 439/157 X |
| 4,648,009 | 3/1987 | Beun et al. | 361/399 |

Primary Examiner—A. D. Pellinen
Assistant Examiner—David Osborn
Attorney, Agent, or Firm—Peter C. Van Der Sluys

[57] ABSTRACT

A locking handle assembly used in combination with printed wiring boards and the like has camming portions which cooperate with a rod on the housing for the boards to act as a lever thereby positively seating and unseating its associated board within the housing. The handle assembly is provided with locking serrations. The serrations are positioned along radial curves so the handle is allowed to undertravel or overtravel, thereby compensating for tolerance buildup which could prevent proper seating of printed wiring assembly. An electrostatic discharge clip of the handle assembly engages the rod on the housing to ground the same and thereby prevent static electricity from the operator from producing an adverse effect on the electronic components.

47 Claims, 5 Drawing Sheets

LOCK HANDLE FOR PRINTED WIRING BOARD ASSEMBLIES AND THE LIKE

BACKGROUND OF THE INVENTION

The invention relates generally to printed wiring board assemblies, and, more particularly, to a locking handle providing means for gripping the printed wiring board assemblies for insertion or extraction thereof.

New central telephone office terminal equipment designed and sold by Alcatel Network Systems of Raleigh, North Carolina provides the introduction of sub-shelf size moveable modules and assemblies, i.e., electrically functional modules and assemblies that, while in service and carrying traffic, can be pulled out of their parent shelf or housing like a book off a bookshelf. Additionally, within the submodules themselves, there are printed wiring board assemblies which must be removed and inserted in the submodules for purposes of servicing, etc.

Present handle assemblies used to manipulate the submodules and assemblies in similar devices require a time consuming riveting operation to mount the handle to a printed wiring board assembly and submodules. Some handles do not provide leverage to insure proper seating of the printed wiring board assemblies. Further, many prior art handles do not lock the board assemblies in their fully seated position. Previously, handles of the prior art would oftentimes require different molded parts depending on the location of the handle (right-hand, left-hand, top or bottom). In addition, there was little or no provision in the prior art to discharge undesirable static electricity transferred from the user to the handle and eventually to the printed wiring board assembly.

The present invention is designed to overcome the above noted limitations, and toward this end, it contemplates the provision of a novel handle assembly for inserting and extracting a printed wiring board assembly from its housing.

It is an object of the present invention to provide a novel handle member which eliminates the time consuming riveting operation by merely sliding the handle on a shaft on a faceplate with both the handle and faceplate captured in place by the printed wiring board assembly.

It is also an object to provide such a device which can release and insert the printed wiring board assembly in an expedited manner.

Still another object is to provide such a device which provides full seating of printed wiring board assembly by compensating for tolerance buildup in housing and board assembly by allowing the handle to lock in place at varying positions.

An additional object is to provide such a device which features an electrostatic discharge clip to discharge static electricity into the frame as the operator proceeds to disengage printed wiring board assembly.

A further object is to provide such a device which utilizes one molded part for right-hand, left-hand, top and bottom applications.

A further object is to provide such a device which may be readily and economically fabricated and will enjoy a long life in operation.

SUMMARY OF THE INVENTION

It has now been found that the foregoing and related objects can be readily obtained in a combination having a support forming an enclosure having a protruding bar thereon, a component such as a printed wiring board releasably mounted within the enclosure, and a locking handle assembly used in manually inserting and extracting the component from the enclosure. The handle assembly may include a faceplate member, a handle member and an electrostatic discharge clip.

The faceplate member is mounted on the component by a mounting yoke and pin combination and includes a flange for locking the handle member to the component.

According to the invention, the handle member is pivotally mounted on a shaft of the faceplate for movement between a closed position and an open position. The handle member has a locking element cooperating with the locking flange of the faceplate to hold the handle member in the closed position. The handle member also has opposed camming portions cooperating with the protruding bar on the support enclosure to facilitate removal and insertion of the component from the enclosure.

The electrostatic discharge clip cooperates with the handle and faceplate members for discharging static electrical energy to protect the component. The electrostatic discharge clip is retained by the handle member and provides an electrical path between the faceplate member and the support. The electrostatic discharge clip can be a spring clip biased against the protruding bar by virtue of its natural resilient memory to provide the electrical path.

Ideally, the locking flange is dimensionally sized to cooperate with the locking element of the handle member to hold the handle member in the closed position. The flange of the faceplate member has serrations thereon for mating with cooperating serrations on the locking element of the handle member. The serrations of the flange and the cooperating serrations of the locking element are positioned along radial curves thereby permitting adjustment of handle member in the closed position to allow for tolerance buildup.

Desirably, the opposed camming portions alternatively engage the protruding bar on the support when the handle member is moved between the open and closed positions. During movement of the handle member between the open and closed positions, the camming portions engage the protruding bar of the support whereby the component is alternatively forced from or into the enclosure by lever action of the handle member on the protruding bar.

In the preferred embodiment, the component is a printed wiring board extending at least partially through the faceplate member and the handle member. An abutment lands on the handle member engage similar lands on the faceplate member to define the open position of the handle.

The invention will be fully understood when reference is made to the following detailed description taken in conjunction with the accompanying drawings.

DETAILED DESCRIPTION OF THE PREFERRED EMBODIMENT

Figure 1:
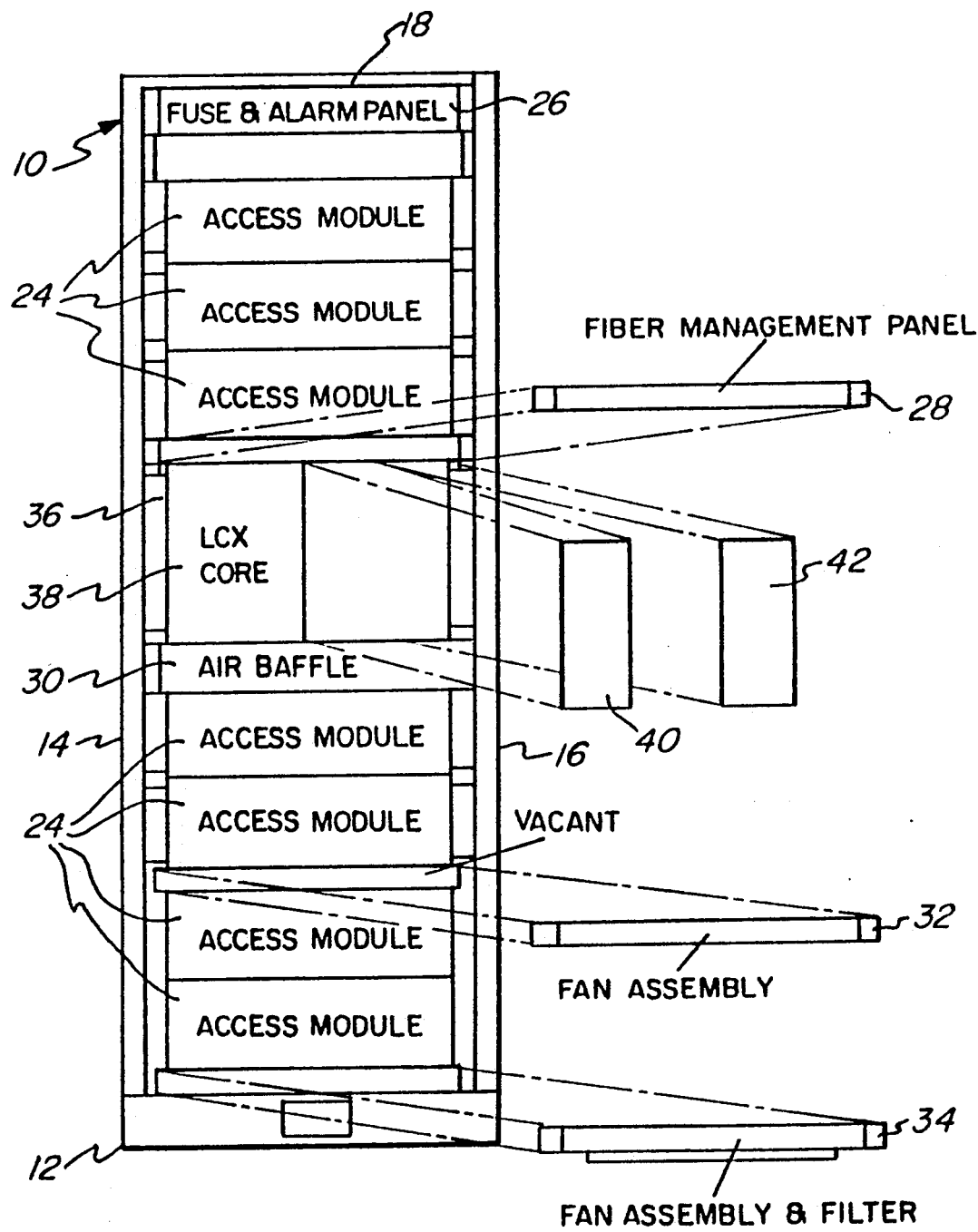
FIG. 1 is a stylized front elevational view of the central office terminal equipment frame of the present invention with various assemblies and submodules shown being removed therefrom or inserted therein.

Turning first to FIG. 1 of the drawing, therein illustrated is a support enclosure generally indicated by the numeral 10 which, in this case, is in the form of a central telephone office terminal equipment frame. The support enclosure 10 has a generally rectangular base panel 12, and extending upwardly from the bottom panel 12 is a pair of U-shaped side panels 14, 16 with a top panel 18 thereon. A rear panel (not shown) completes the support enclosure 10 thereby defining a generally rectangular cavity therein.

Slideably received in the generally rectangular cavity of the support enclosure 10 is a plurality of slideable subframe components which can be various modules 24, for example, electronic components for transmission of telephone signals, and associated assemblies such as fuse and alarm panel 26, fiber management panel 28, air baffle 30, fan assembly 32 and fan and filter assembly 34. Centrally located in the support enclosure 10 is a subframe mounting assembly 36 having three functional submodules 38, 40 and 42 mounted therein.

Figure 2:
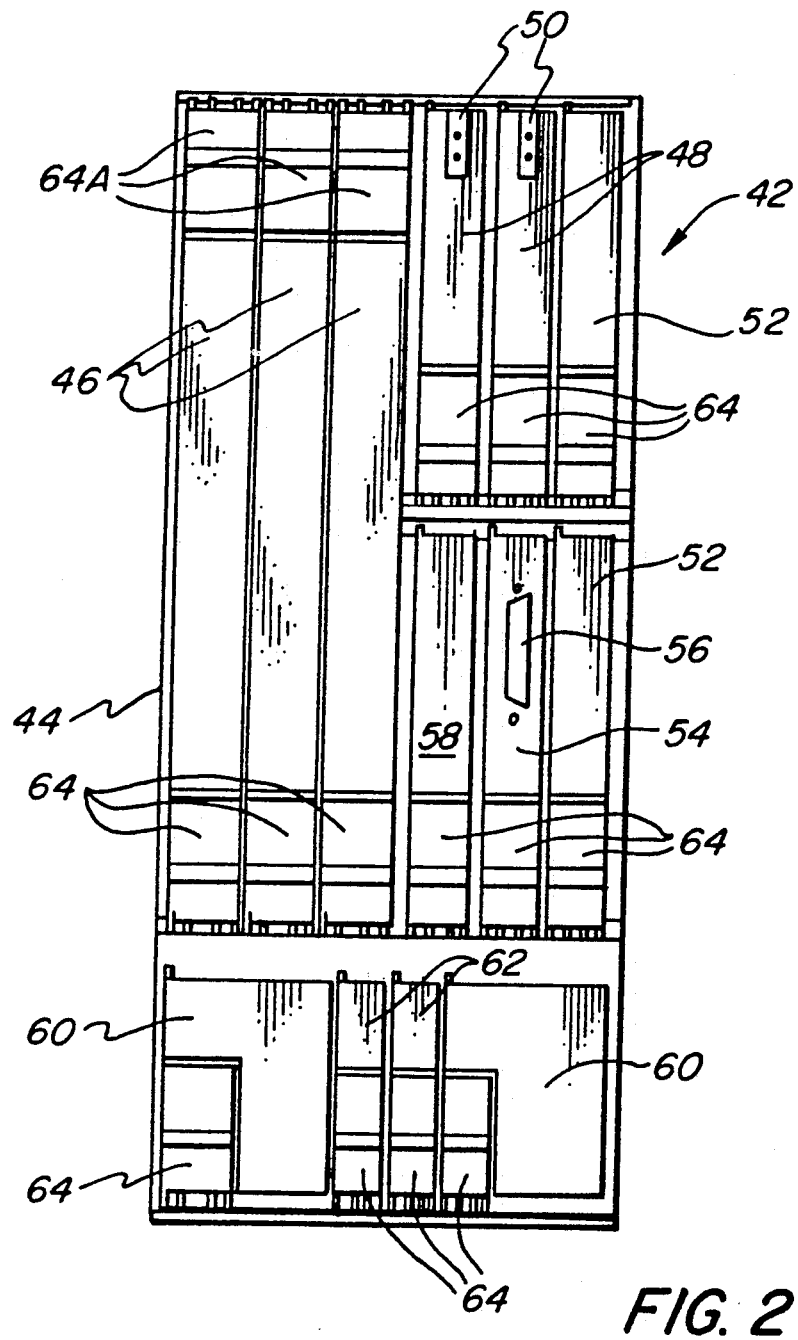
FIG. 2 is a front elevational view of a submodule from FIG. 1 employing a multiplicity of locking handles of the present invention.
Figure 4:
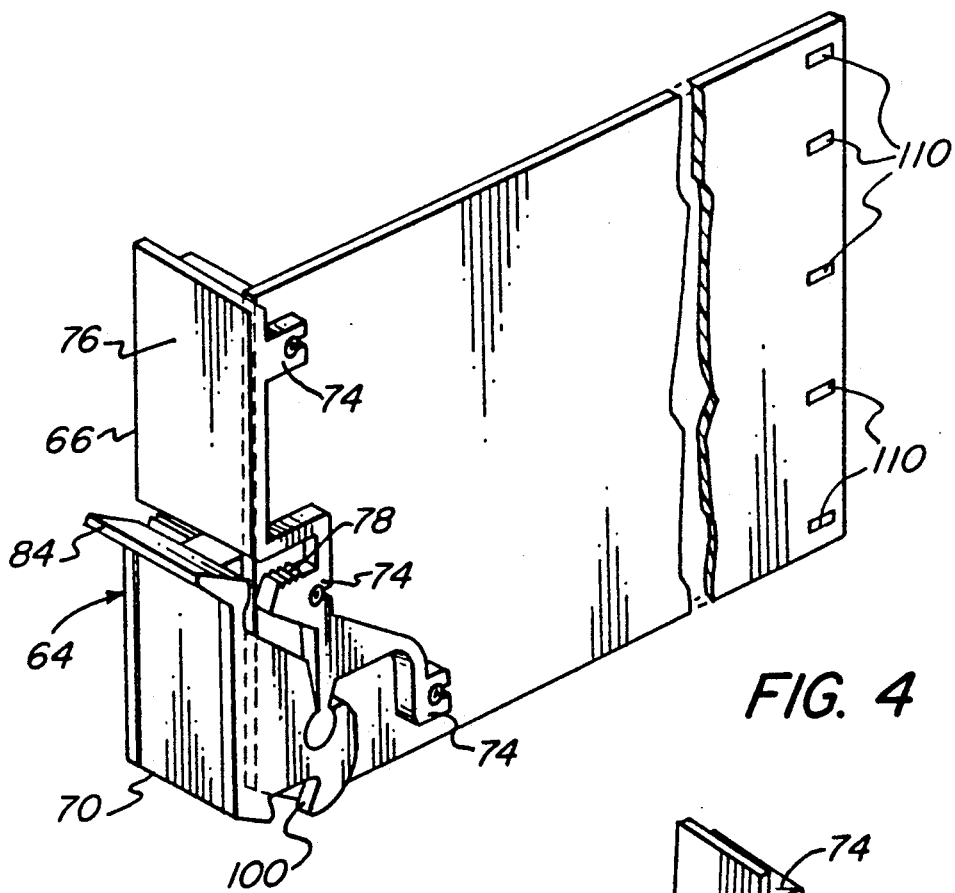
FIG. 4 is a perspective view of a printed wiring board assembly employing the locking handle of the present invention.
Figure 3:
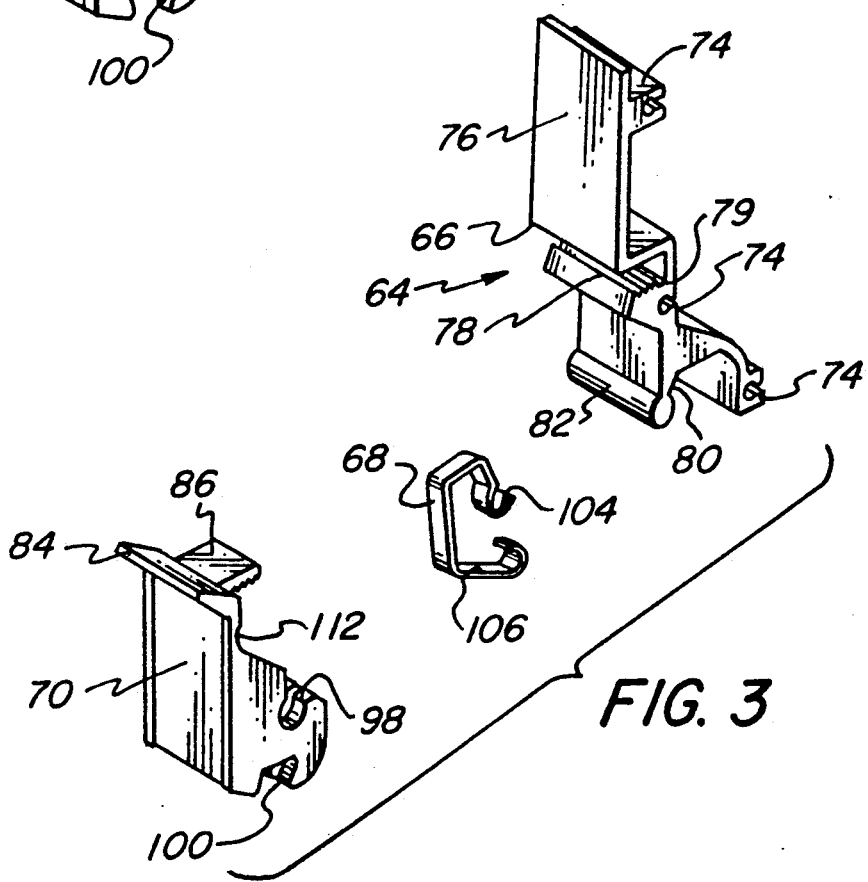
FIG. 3 is an exploded perspective view of the locking handle of the present invention.

One of the submodules 42 will now be described in detail with particular reference to FIG. 2. The submodule 42 is a fiber optic transmission system and includes a slideable drawer 44 that can be moved into and out of the support enclosure 10. The drawer 44 has a generally rectangular shape and includes a multiplicity of printed wiring board assemblies slideably received therein. On the left side of the submodule 42 are three large printed wiring board assemblies 46 at least one of which is an alarm and control board. Located to the right of printed wiring board assemblies 46 are two smaller printed wiring board assemblies which are optical transmitter/receivers or transceivers 48, one active and one backup. In this case, each transceiver 48 has a pair of fiber optic cables 50 connected thereto at the upper portion thereof. The submodule 42 also is provided with two clock printed wiring board assemblies 52 for providing timing for the submodule 42. One of the clocks 52 is for backup purposes. Next to the lower clock 52 is a craft orderwire access 54 with a plug-in connector 56 into which auxiliary equipment can be connected for testing purposes. Also included in the row with the lower clock 52 and the craft orderwire access 54 is a protection switch element 58 for switching to the backup system in case of a primary failure. The two larger units 60 in the bottom row are power supplies for energizing the submodule 42. In between the power supplies 60 are two synchronization maintenance interface printed wiring board assemblies 62 providing an interface between the submodule 42 and external system synchronization and maintenance facilities (not shown).

Each of the printed wiring board assemblies 46, 48, 52 54, 58 and 62 and also power supplies 60 have a locking handle assembly 64 positioned at the lower edge thereof. In addition to its lower handle 64, each of the large printed wiring board assemblies 46 has an upper locking handle 64A along its upper edge thereof. The upper handles 64A are identical to the handles 64 except they are inverted.

Turning now to FIGS. 3-8, the locking handle 64 is shown in greater detail. The handle 64 is comprised of a faceplate member 66, an electrostatic discharge clip 68 and a handle member 70. The faceplate member 66 is made of extruded aluminum alloy cut to an appropriate size and is mounted to a printed wiring board 72 by means of three mounting yokes 74. The faceplate member 66 has a faceplate portion 76, a locking flange portion 78 with serrated teeth 79 and a handle retaining portion 80 with a pivot shaft 82 thereon.

Figure 7:
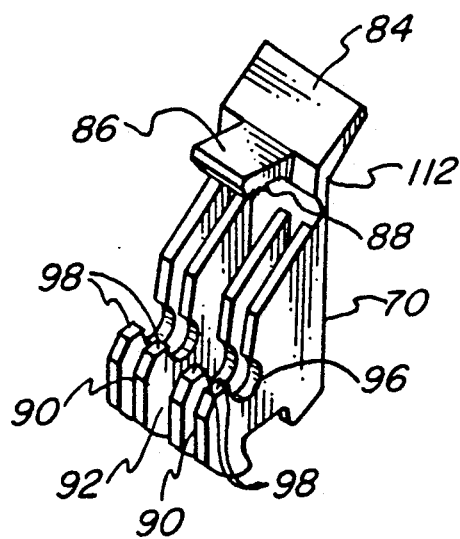
FIG. 7 is a perspective view of the handle member of the present invention.

The handle member 70 is shown in FIG. 7 as having a finger gripping portion 84 to allow manual manipulation of the locking handle assembly 64 by the user, a locking finger 86 with serrated teeth 88 thereon to mate with serrated teeth 79 of the faceplate member 66, a pair of spaced slots 90 for receiving and providing clearance for the printed wiring board 72, a centrally located slot 92 for receiving the electrostatic discharge clip 68, a semicircular cutout area 96 dimensionally sized to accept the pivot shaft 82, a plurality of abutment lands 98 which interact with the handle retaining portion 80 to limit movement of handle member 70, and camming portions 100 and 101 to cooperate with a locking bar 102 on the drawer 44 as will be explained further hereinafter. The handle member 70 is molded of a resilient plastic resin such as nylon.

Figure 8:
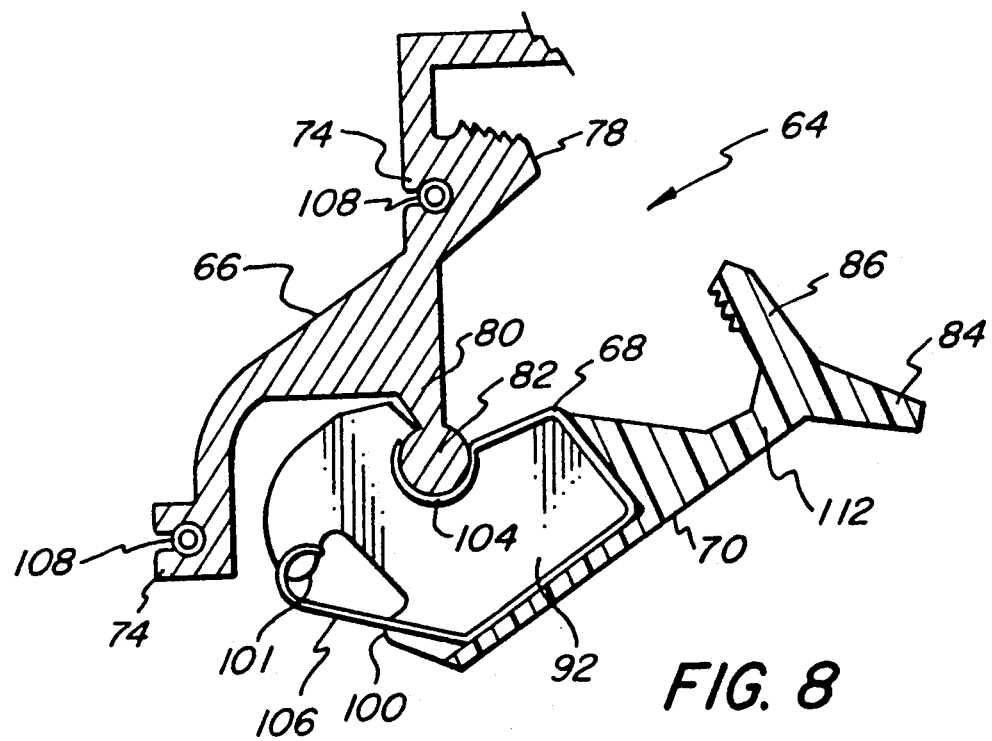
FIG. 8 is a cross-sectional view of the locking handle in the open position revealing internal structure.

The electrostatic discharge clip 68 is best seen in FIG. 8 and is dimensionally sized to fit loosely within the centrally located slot 92. It has a shaft connecting portion 104 sized to wrap partially around pivot shaft 82 and a bar engaging portion 106 to engage the locking bar 102 (See FIGS. 5 and 6). To perform its electrostatic discharge function, the electrostatic discharge clip 68 must be electrically conductive and is preferably made from 0.010 inch spring tempered phosphor bronze.

To assemble the locking handle assembly 64, the electrostatic discharge clip 68 is placed within the centrally located slot 92 of the handle member 70 and both are slid axially along the pivot shaft 82 of the faceplate member 66 until centrally located thereon. The faceplate member 66 is provided with a slot (not shown), extending through the mounting yokes 74, locking flange portion 78 and handle retaining portion 80 but not through faceplate portion 76, cut in an appropriate desired position therealong into which the printed wiring board 72 is inserted. The printed wiring board 72 extends into one of the spaced slots 90 of the handle member 70. Thereinafter, mounting pins 108 are slid into the mounting yokes 74 and forced through printed wiring board 72 to hold the locking handle assembly 64 in assembly with printed wiring board 72. The locking handle assembly 64 is symmetrically designed to allow right-hand, left-hand, top and bottom applications.

Figure 5:
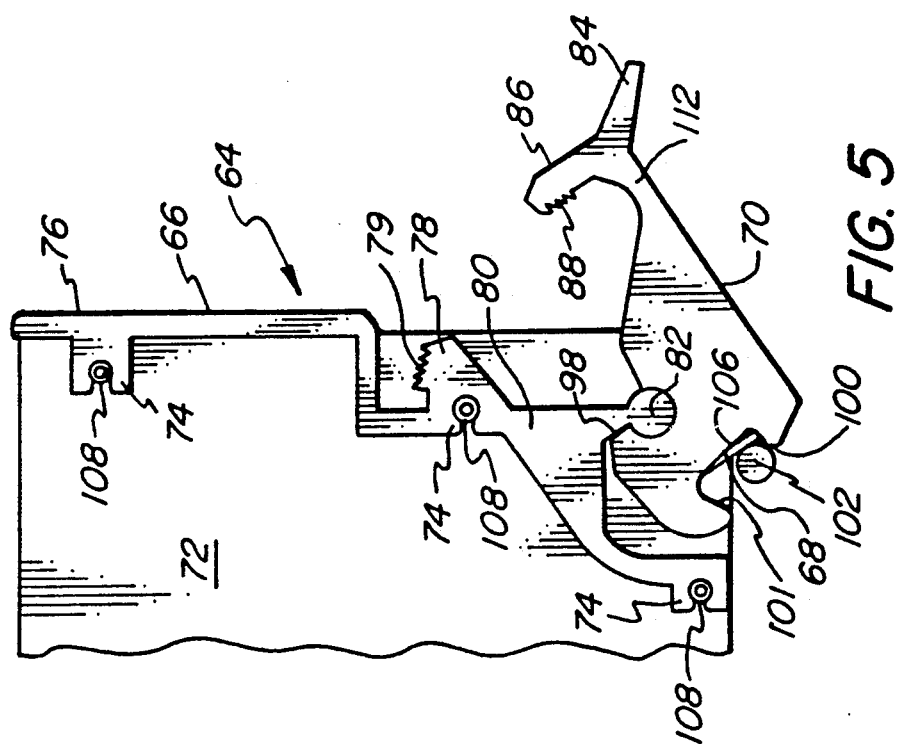
FIGS. 5 and 6 are partial side elevational views of the present locking handle invention with the handle in its open and closed positions, respectively.
Figure 6:
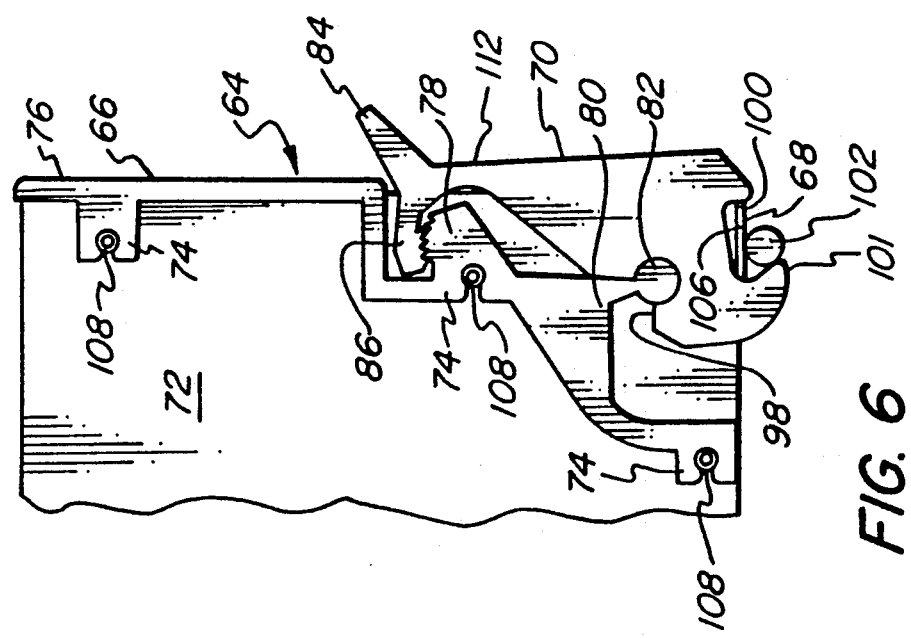

Referring to FIGS. 5 and 6, the use of the locking handle assembly 64 can be best understood. The printed wiring board 72 generally has male connectors 110 (FIG. 4) on the end of the printed wiring board 72 opposite the locking handle assembly 64. These male connectors 110 mate with the female connectors (not shown) on the drawer 44 to provide the desired electrical communication between the printed wiring board 72 and the rest of the central office terminal. In order to provide proper seating of the male connectors 110 in the female connectors, the locking handle assembly 64 acts as a lever to insert or extract the printed wiring board 72. In order to accomplish this, the camming portions 100, 101 of the locking handle assembly 64 act in cooperation with the locking bar 102 which is rigidly mounted on and grounded to the drawer 44. To insert the printed wiring board 72, the handle member 70 is placed in its open position as shown in FIG. 5 and the entire locking handle assembly 64 is pushed by the user by manipulating the finger gripping portion 84 until the camming portions 100, 101 engage locking 102. At this point, the handle member 70 is rotated on the pivot shaft 82 of the handle retaining portion 80 until the camming portions 101 engages the locking bar 102 as the complementary serrations 79, 88 of the locking flange portion 78 and locking finger 86 interlock whereby the engagement of camming portion 101 with locking bar 102 produces a lever action which forces the male connectors 110 of the printed wiring board 72 into proper seating in the female connectors (not shown) on the drawer 44. It should be noted that the handle member 70 is resilient enough to flex around its necked down portion 112 to facilitate the interlocking and unlocking of the serrations 79, 88. The serrations 79, 88 are positioned along radial curves so the handle member 70 is allowed to undertravel or overtravel, thereby compensating for tolerance buildup which could prevent proper seating of printed wiring board 72.

When the handle member 70 is in the closed, seated position of FIG. 6, the natural resiliency of the electrostatic discharge clip 68 biases its bar engaging portion 106 into positive electrical contact with the locking bar 102. The electrostatic discharge clip 68 grounds the locking handle assembly 64 through the locking bar 102 and the drawer 44. Accordingly, static electrical energy from an operator manipulating the locking handle assembly 64 will be transferred to ground rather than into the printed wiring board 72.

To remove the printed wiring board 72, the above described operation is reversed initiating cooperation the between camming portion 100 and locking bar 102. As the handle member 70 is pivoted to the open position, such cooperation produces a lever action to unseat the male connectors 110 from the female connectors.

It should be appreciated by those skilled in the art that the locking handle may be used on any type of printed wiring assembly, plug-in module or similar device requiring to be plugged in and positively retained in its associated assembly.

Thus, it can be seen from the foregoing specification attached drawings that the locking handle assemble of the present invention provides an effective means for inserting and extracting printed wiring board assemblies and the like.

The preferred embodiment described above admirably achieves the objects of the invention; however, it will be appreciated that departures can be made by those skilled in the art without departing from the spirit and scope of the invention which is limited only by the following claims.

Having thus described the invention, what is claimed is:

1. A locking handle assembly for use in manually inserting and extracting a component from an enclosure formed in a support having a protruding feature thereon, comprising:

a faceplate member mounted on the component, said faceplate member having means mounting said faceplate member to the component, means for pivotally mounting a handle member thereon for pivotal movement about a single axis, and means on said faceplate member for locking a handle member thereto; and a handle member pivotally mounted on said pivotal mounting means of said faceplate member for pivotal movement about a single axis between a closed position with the component fully inserted within the enclosure and an open position with the component at least partially extracted from the enclosure, said handle member having a locking element for variably engaging said locking means of said faceplate member in a plurality of positions to adjustably hold said handle member in said closed position thereby compensating for tolerance buildup in the handle assembly, component and support, said handle member having means for engaging the protruding feature of the enclosure when said handle member is moved to its closed position.

2. The locking handle assembly in accordance with claim 1, wherein said locking means is a flange dimensionally sized to engage said locking element of said handle member to hold said handle member in said closed position.

3. The locking handle assembly in accordance with claim 2, wherein said flange of said faceplate member has serrations thereon for mating with cooperating serrations on said locking element of said handle member.

4. The locking handle assembly in accordance with claim 3, wherein said serrations of said flange and said cooperating serrations of said locking element are positioned along radial curves thereby permitting adjustment of handle member in said closed position to allow for tolerance buildup.

5. The locking handle assembly in accordance with claim 2, wherein said pivotal movement is limited by abutment means defining said open position of said handle member.

6. The locking handle assembly in accordance with claim 1, wherein said pivotal mounting means of said faceplate is a shaft upon which said handle member is mounted for pivotal movement between said closed and open positions.

7. The locking handle assembly in accordance with claim 1, wherein said mounting means on said faceplate are a plurality of mounting yokes for receiving mounting pins driven through the component.

8. The locking handle assembly in accordance with claim 1, further including an electrostatic discharge means for discharging static electrical energy to protect the component.

9. The locking handle assembly in accordance with claim 8, wherein said electrostatic discharge means is an electrostatic discharge clip retained by said handle member and providing an electrical path between said faceplate member and the enclosure.

10. In combination,
A. a support forming an enclosure having a protruding feature thereon;
B. a component releasably mounted within said enclosure; and
C. a locking handle assembly used in manually inserting and extracting said component from said enclosure, comprising:

i. a faceplate member mounted on said component, said faceplate member having means mounting said faceplate member to said component, means for pivotally mounting a handle member thereon for pivotal movement about a single axis, and means on said faceplate member for locking a handle member thereto; and ii. a handle member pivotally mounted on said pivotal mounting means of said faceplate member for pivotal movement about a single axis between a closed position with said component fully inserted within said enclosure and an open position with said component at lest partially extended from the enclosure, said handle member having a locking element for variably engaging said locking means of said faceplate member in a plurality of positions to adjustably hold said handle member in said closed position thereby compensating for tolerance buildup in said handle assembly, component and support, said handle member having means for engaging said protruding feature of said support when said handle member is moved to its closed position.

11. The combination in accordance with claim 10, wherein said locking means is a flange dimensionally sized to engage said locking element of said handle member to hold said handle member in said closed position.

12. The combination in accordance with claim 11, wherein said flange of said faceplate member has serrations thereon for mating with cooperating serrations on said locking element of said handle member.

13. The combination in accordance with claim 12, wherein said serrations of said flange and said cooperating serrations of said locking element are positioned along radial curves thereby permitting adjustment of handle member in said closed position to allow for tolerance buildup.

14. The combination in accordance with claim 10, wherein said pivotal mounting means of said faceplate is a shaft upon which said handle member is mounted for pivotal movement between said closed and open positions.

15. The combination in accordance with claim 14, wherein said pivotal movement is limited by abutment means defining said open position of said handle member.

16. The combination in accordance with claim 10, wherein said mounting means on said faceplate are a plurality of mounting yokes for receiving mounting pins driven through said component.

17. The combination in accordance with claim 10, further including an electrostatic discharge means for discharging static electrical energy to protect said component.

18. The combination in accordance with claim 17, wherein said electrostatic discharge means is an electrostatic discharge clip retained by said handle member and providing an electrical path between said faceplate member and said support.

19. The combination in accordance with claim 18, wherein said electrostatic discharge clip is biased against said protruding feature of said support to provide said electrical path.

20. The combination in accordance with claim 19, wherein said electrostatic discharge clip is a spring clip biased against said protruding feature by virtue of its natural resilient memory.

21. The combination in accordance with claim 10, wherein said means for engaging said protruding portion has camming means cooperating with said protruding feature on said support enclosure to facilitate removal and insertion of said component from said enclosure.

22. The combination in accordance with claim 21, wherein said camming means has opposed camming portions which alternatively engage said protruding feature on said support when said handle member is moved between said open and closed positions.

23. The combination in accordance with claim 22, wherein during movement of said handle member between said open and closed positions, said camming portions engage said protruding feature of said support whereby said component is alternatively forced from or into said enclosure by lever action of said handle member on said protruding feature.

24. The combination in accordance with claim 10, wherein said component is a printed wiring board.

25. The combination in accordance with claim 24, wherein said printed wiring board extends at least partially through said faceplate member and said handle member.

26. In combination,
A. a support forming an enclosure having a protruding feature thereon;
B. a component releasably mounted in said enclosure; and
C. a handle assembly used in manually inserting and extracting said component from said enclosure, comprising:
i. a faceplate member mounted on the component, said faceplate member having means mounting said faceplate member to said component and means for pivotally mounting a handle member thereon;
ii. a handle member pivotally mounted on said pivotal mounting means of said faceplate member for movement between a closed position with said component fully inserted in said enclosure and an open position with said component at least partially extracted from said enclosure, said handle member having means for engaging said protruding feature of said enclosure when said handle member is moved to its closed position; and
iii. electrostatic discharge means providing grounding electric contact between said protruding feature and said handle and said faceplate members for discharging static electrical energy to protect said component.

27. The combination in accordance with claim 26, wherein said electrostatic discharge means is an electrostatic discharge clip retained by said handle member and providing an electrical path between said faceplate member and the support.

28. The combination in accordance with claim 27, wherein said electrostatic discharge clip is biased against said protruding feature of said support to provide said electrical path.

29. The combination in accordance with claim 28, wherein said electrostatic discharge clip is a spring clip biased against said protruding feature by virtue of its natural resilient memory.

30. The combination in accordance with claim 26, wherein said means for engaging said protruding portion has camming means cooperating with said protruding feature on said support enclosure to facilitate removal and insertion of said component from said enclosure.

31. The combination in accordance with claim 30, wherein said camming means has opposed camming portions which alternatively engage said protruding feature on said support when said handle member is moved between said open and closed positions.

32. The combination in accordance with claim 31, wherein during movement of said handle member between said open and closed positions, said camming portions engage said protruding feature of said support whereby said component is alternatively forced from or into said enclosure by lever action of said handle member on said protruding feature.

33. The combination in accordance with claim 26, wherein said component is a printed wiring board.

34. The combination in accordance with claim 33, wherein said printed wiring board extends at least partially through said faceplate member and said handle member.

35. In combination,
   A. a support forming an enclosure having a protruding feature thereon;
   B. a component releasably mounted within said enclosure; and
   C. a locking handle assembly used in manually inserting and extracting said component from said enclosure, comprising:
      i. a faceplate member mounted on said component, said faceplate member having means mounting said faceplate member to said component, means for pivotally mounting a handle member thereon for pivotal movement about a single axis, and means on said faceplate member for locking a handle member thereto;
      ii. a handle member pivotally mounted on said pivotal mounting means of said faceplate for pivotal movement about a single axis between a closed position with said component fully inserted within said enclosure and an open position with said component at least partially extracted from said enclosure, said handle member having a locking element cooperating with said locking means of said faceplate to hold said handle member in said closed position, said handle member having camming means engaging said protruding feature on said support enclosure to facilitate removal and insertion of said component from said enclosure; and
      iii. electrostatic discharge means providing grounding electrical contact between protruding feature and said handle and faceplate members for discharging static electrical energy to protect said component.

36. A locking handle assembly for use in manually inserting and extracting a component from an enclosure, comprising:
   a faceplate member mounted on the component, said faceplate member having means mounting said faceplate member to the component, means for pivotally mounting a handle member thereon, and means for locking a handle member thereto; and
   a handle member pivotally mounted on said pivotal mounting means of said faceplate for movement between a closed position and an open position, said handle member having a locking element cooperating with said locking means of said faceplate member to hold said handle member in said closed position;
   said locking means of said faceplate member is a flange dimensionally sized to cooperate with said locking element of said handle member to hold said handle member in said closed position, said flange of said faceplate member has serrations thereon for mating with cooperating serrations on said locking element of said handle member.

37. The locking handle assembly in accordance with claim 36, wherein said serrations of is flange and said cooperating serrations of said locking element are positioned along radial curves thereby permitting adjustment of handle member in said closed position to allow for tolerance buildup.

38. In combination,
   A. a support forming an enclosure having a protruding feature thereon;
   B. a component releasably mounted within said enclosure; and
   C. a locking handle assembly used in manually inserting and extracting said component from said enclosure, comprising:
      i. a faceplate member mounted on said component, said faceplate member having means mounted said faceplate member to said component, means for pivotally mounting a handle member thereon, and means for locking a handle member thereto; and
      ii. a handle member pivotally mounted on said pivotal mounting means of said faceplate member for movement between a closed position and an open position, said handle member having a locking element for cooperating with said locking means of said faceplate member to hold said handle member in said closed position, said flange of is faceplate member has serrations thereon for mating with cooperating serrations on said locking element of said handle member.

39. The combination in accordance with claim 38, wherein said serrations of said flange and said cooperating serrations of said locking element are positioned along radial curves thereby permitting adjustment of handle member in said closed position to allow for tolerance buildup.

40. A handle assembly for use in manually inserting and extracting a component from a support forming an enclosure having a protruding feature thereon, comprising:
   A. a faceplate member mounted on the component, said faceplate member having means mounting said faceplate member to the component and means for pivotally mounting a handle member thereon;
   B. a handle member pivotally mounted on said pivotal mounting means of said faceplate member for movement between a closed position with the component fully inserted in the enclosure and an open position with the component at least partially extracted from the enclosure, said handle member having means for engaging the protruding feature of the enclosure when said handle member is moved to its closed position; and
   electrostatic discharge means providing grounding electric contact between the protruding feature and said handle and faceplate members for discharging electrical energy to protect the component.

41. The handle assembly in accordance with claim 40, wherein said electrostatic discharge means is an electrostatic discharge clip retained by said handle member and providing an electrical path between said faceplate member and the support.

42. The handle assembly in accordance with claim 41, wherein said electrostatic discharge clip is biased against the protruding feature of the support to provide the electrical path.

43. The handle assembly in accordance with claim 42, wherein said electrostatic discharge clip is a spring clip biased against the protruding feature by virtue of its natural resilient memory.

44. The handle assembly in accordance with claim 40, wherein said means for engaging the protruding portion has camming means cooperating with the protruding feature on the support enclosure to facilitate removal and insertion of the component from the enclosure.

45. The handle assembly in accordance with claim 44, wherein said camming means has opposed camming portions which alternatively engage the protruding feature on the support when said handle member is moved between said open and closed positions.

46. The handle assembly in accordance with claim 45, wherein during movement of said handle member between said open and closed positions, said camming portions engage the protruding feature of the support whereby the component is alternatively forced from or from the enclosure by lever action of said handle member on the protruding feature.

47. The handle assembly in accordance with claim 40, wherein the component is a printed wiring board.

* * * * *